(12) United States Patent
Amano et al.

(10) Patent No.: US 8,617,318 B2
(45) Date of Patent: Dec. 31, 2013

(54) LIQUID PROCESSING APPARATUS AND LIQUID PROCESSING METHOD

(75) Inventors: Yoshifumi Amano, Koshi (JP); Satoshi Kaneko, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 122 days.

(21) Appl. No.: 12/678,013

(22) PCT Filed: May 25, 2009

(86) PCT No.: PCT/JP2009/059496
§ 371 (c)(1),
(2), (4) Date: Apr. 10, 2010

(87) PCT Pub. No.: WO2009/147962
PCT Pub. Date: Dec. 10, 2009

(65) Prior Publication Data
US 2011/0048468 A1    Mar. 3, 2011

(30) Foreign Application Priority Data

Jun. 5, 2008  (JP) ................................ 2008-148163
Jun. 5, 2008  (JP) ................................ 2008-148175

(51) Int. Cl.
*B08B 3/00*    (2006.01)

(52) U.S. Cl.
USPC .......... 134/32; 134/94.1; 134/95.1; 134/95.3; 134/157; 134/902

(58) Field of Classification Search
USPC ......... 134/94.1, 95.1, 95.3, 105, 157, 902, 32
See application file for complete search history.

(56) References Cited

U.S. PATENT DOCUMENTS 6,984,477 B2 *  1/2006 Ogata et al. ..................... 430/22
7,138,014 B2 * 11/2006 Stevens et al. .................. 118/50
(Continued)

FOREIGN PATENT DOCUMENTS

JP    2005-317817 A1    11/2005
JP    2006-013194 A1    1/2006
(Continued)

OTHER PUBLICATIONS

English Machine Translation of JP 2007-235065 A.*

(Continued)

*Primary Examiner* — Michael Barr
*Assistant Examiner* — Benjamin L Osterhout
(74) *Attorney, Agent, or Firm* — Burr & Brown, PLLC

(57) ABSTRACT

A liquid processing apparatus including: a second housing; a first housing capable of being brought into contact with the second housing; a holding part configured to hold an object to be processed; a rotation driving part configured to rotate the object to be processed held by the holding part; front-side process-liquid supply nozzle configured to supply a process liquid onto a peripheral portion of a front surface of the object to be processed held by the holding part; and a storage part disposed on a side of a rear surface of the object to be processed held by the holding part, the storage part being configured to store the process liquid having been passed through the object to be processed. The respective first housing and the second housing can be moved in one direction, so that the first housing and the second housing can be brought into contact and separated from each other.

10 Claims, 3 Drawing Sheets

(56) References Cited

U.S. PATENT DOCUMENTS

| | | |
|---|---|---|
| 7,264,008 B2 * | 9/2007 | Kim et al. .................... 134/151 |
| 2006/0021636 A1 | 2/2006 | Miya |
| 2006/0286300 A1 * | 12/2006 | Ishikawa et al. .............. 427/331 |
| 2007/0062647 A1 | 3/2007 | Bailey et al. |
| 2007/0113874 A1 * | 5/2007 | Izumi et al. .................... 134/33 |
| 2007/0283983 A1 * | 12/2007 | Park et al. ..................... 134/21 |
| 2008/0014358 A1 * | 1/2008 | Koo et al. ................... 427/372.2 |
| 2008/0057194 A1 * | 3/2008 | Tanaka ......................... 427/240 |
| 2008/0057219 A1 | 3/2008 | Kim et al. |

FOREIGN PATENT DOCUMENTS

| | | | |
|---|---|---|---|
| JP | 2006-041444 A1 | 2/2006 | |
| JP | 2006-041445 A1 | 2/2006 | |
| JP | 2007-142077 A1 | 6/2007 | |
| JP | 2007-235065 A1 | 9/2007 | |
| JP | 2007235065 A | * 9/2007 | |
| JP | 2008-060578 A1 | 3/2008 | |
| KR | 2007-0050638 A1 | 5/2007 | |
| TW | 200307985 | 12/2003 | |
| TW | 200713413 | 4/2007 | |
| WO | 03/103030 A1 | 12/2003 | |

OTHER PUBLICATIONS

Machine Translation of JP 2008-060578 to Kim et al., Mar. 2008.*
Korean Office Adtion for KR 10-2010-7008858 to Amano et al., Jun. 14, 2011.
Taiwanese Office Action dated Sep. 18, 2012.

* cited by examiner

LIQUID PROCESSING APPARATUS AND LIQUID PROCESSING METHOD

CROSS REFERENCE TO RELATED APPLICATIONS

This application is based upon and claims the benefit of priority from the prior Japanese Patent Application Nos. 2008-148163 and 2008-148175 which were filed on Jun. 5, 2008, the entire contents of which are incorporated herein by reference.

FIELD OF THE INVENTION

The present invention relates to a liquid processing apparatus and a liquid processing method, configured to supply a cleaning liquid to a peripheral portion of an object to be processed such as a semiconductor wafer.

BACKGROUND OF THE INVENTION

There has been conventionally known a substrate processing apparatus (liquid processing apparatus) including: a substrate holding means (holding part) configured to hold a substrate (object to be processed) such as a semiconductor wafer; a rotating means (rotation driving part) configured to rotate the substrate held by the substrate holding means; and a nozzle configured to supply a process liquid to a peripheral portion of an upper surface of the rotating substrate (see, JP2006-41444A).

However, in the structure of the conventional technique shown in JP2006-41444A, a process space for processing an edge part is opened. Thus, it is difficult to control an atmosphere in the process space, and a large amount of cleaning liquid is evaporated. In addition, it is necessary for a collecting cup for collecting a spun-off process liquid to have a size allowing that an outside part of the periphery of the wafer is surrounded by the collecting cup, which invites enlargement of the liquid processing apparatus.

SUMMARY OF THE INVENTION

The present invention provides a liquid processing apparatus which is capable of easily controlling an atmosphere in a process space of a peripheral portion of an object to be processed. Further, a horizontal size of the liquid processing apparatus is reduced, and the process space in which the object to be processed is processed is made smaller. The present invention is also provides a liquid processing apparatus using such a liquid processing apparatus.

A liquid processing apparatus according to the present invention is a liquid processing apparatus comprising:
a second housing;
a first housing disposed oppositely to the second housing;
a holding part disposed inside the second housing, the holding part being configured to hold an object to be processed;
a rotation driving part configured to rotate the object to be processed held by the holding part;
a front-side process-liquid supply nozzle configured to supply a process liquid onto a peripheral portion of a front surface of the object to be processed held by the holding part; and
a storage part disposed on a side of a rear surface of the object to be processed held by the holding part, the storage part being configured to receive the process liquid having been passed through the object to be processed and store the process liquid;
wherein the respective first housing and the second housing can be moved in one direction, so that the first housing and the second housing can be brought into contact with each other and separated apart from each other.

A liquid processing method according to the present invention is a liquid processing method to be performed by a liquid processing apparatus comprising: a second housing; a first housing disposed oppositely to the second housing; a holding part disposed inside the second housing, the holding part being configured to hold an object to be processed; and a storage part disposed on a side of a rear surface of the object to be processed held by the holding part;
the liquid processing method comprising:
separating the respective first housing and the second housing apart from each other;
holding the object to be processed by the holding part;
bringing the respective first housing and the second housing close to each other and into contact with each other;
rotating the object to be processed held by the holding part;
supplying a process liquid onto a peripheral portion of a front surface of the object to be processed held by the holding part; and
receiving the process liquid having been passed through the object to be processed by the storage part and storing the process liquid in the storage part.

According to the present invention, since the respective first housing and the second housing can be moved in the one direction, so that the first housing and the second housing can be brought into contact with each other and separated apart from each other. Thus, a horizontal size of the liquid processing apparatus can be reduced. In addition, since the process space in which the peripheral portion of the wafer is processed is defined when the first housing and the second housing are in contact with each other, the process space can be made smaller. Therefore, an atmosphere in the process space can be easily controlled, and an amount of an evaporated cleaning liquid can be decreased.

DETAILED DESCRIPTION OF THE INVENTION

Below, an embodiment of the liquid processing apparatus according to the present invention is described with reference to the drawings. FIG. 1 to FIGS. 3(a) and 3(b) are views showing the embodiment of the present invention.

Figure 1:
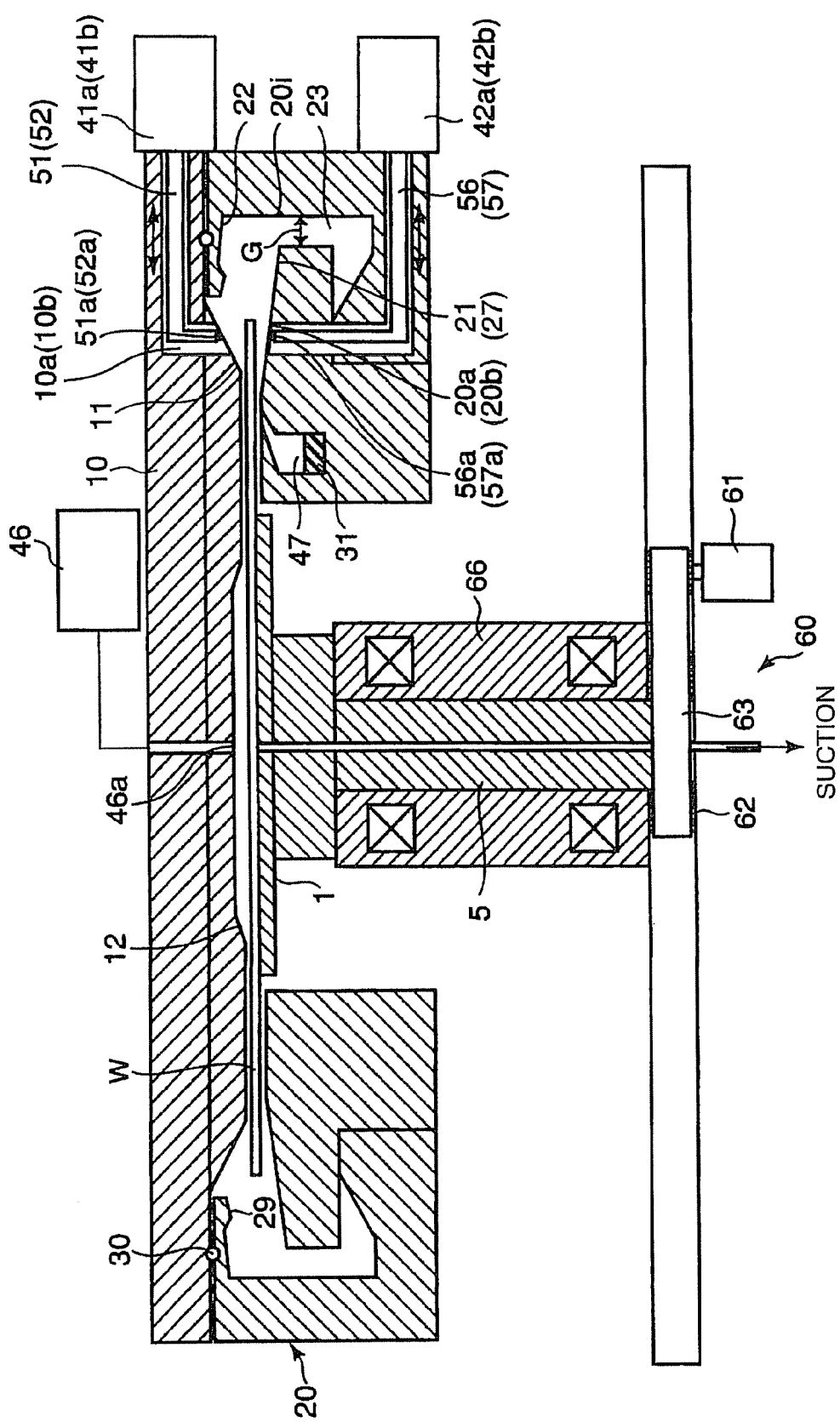
FIG. 1 is a schematic longitudinal sectional view showing a liquid processing apparatus in one embodiment of the present invention.

As shown in FIG. 1, the liquid processing apparatus comprises: a lower cup (second housing) 20; an upper cup (first housing) 10 disposed oppositely to the lower cup 20, the upper cup 10 being capable of being brought into contact with the lower cup 20; a holding part 1 disposed inside the lower cup 20, the holding part 1 being configured to hold a semiconductor wafer W (hereinafter referred to as "wafer W") as an object to be processed; a rotating shaft 5 extending downward from the holding part 1; and a rotation driving part 60 configured to drive and rotate the rotating shaft 5 so as to rotate the wafer W held by the holding part 1. The holding part 1 holds the wafer W by vacuum suction.

As shown in FIG. 1, the rotation driving part 60 includes: a pulley 62 disposed outside a periphery of the rotating shaft 5; a driving belt 63 wound around the pulley 62; and a motor 61 configured to impart a driving force to the driving belt 63 so as to rotate the rotating shaft 5 through the pulley 62. Further, a bearing 66 is disposed outside the periphery of the rotating shaft 5.

As shown in FIG. 1, the upper cup 10 is provided with a seal member 30 formed of, e.g., an O-ring. The respective upper cup 10 and the lower cup 20 can be moved in an up and down direction, so that the upper cup 10 and the lower cup 20 can be brought into contact with each other and separated apart from each other (see, FIGS. 3(*a*) and 3(*b*)). When the upper cup 10 and the lower cup 20 are in contact with each other, a gap between the upper cup 10 and the lower cup 20 is hermetically sealed by the seal member 30. In this embodiment, the seal member 30 is provided on the upper cup 10 (see, FIG. 3(*a*)). However, not limited thereto, the seal member 30 may be provided on the lower cup 20.

As shown in FIG. 1, at a position opposed to a peripheral portion of a front surface of the wafer W held by the holding part 1, the upper cup 10 has a front-side inclined part 11 that is inclined upward so as to draw away from the wafer W toward the periphery of the wafer W. The front-side inclined part 11 is equipped with elongate holes 10*a* and 10*b*. Disposed in the elongate holes 10*a* and 10*b* are front-side process-liquid supply nozzles 51*a* and 52*a* which are configured to supply a cleaning liquid (process liquid) onto the peripheral portion of the front surface of the wafer W. In FIG. 1, the front surface of the wafer W is positioned above, and a rear surface of the wafer W is positioned below.

Figure 2:
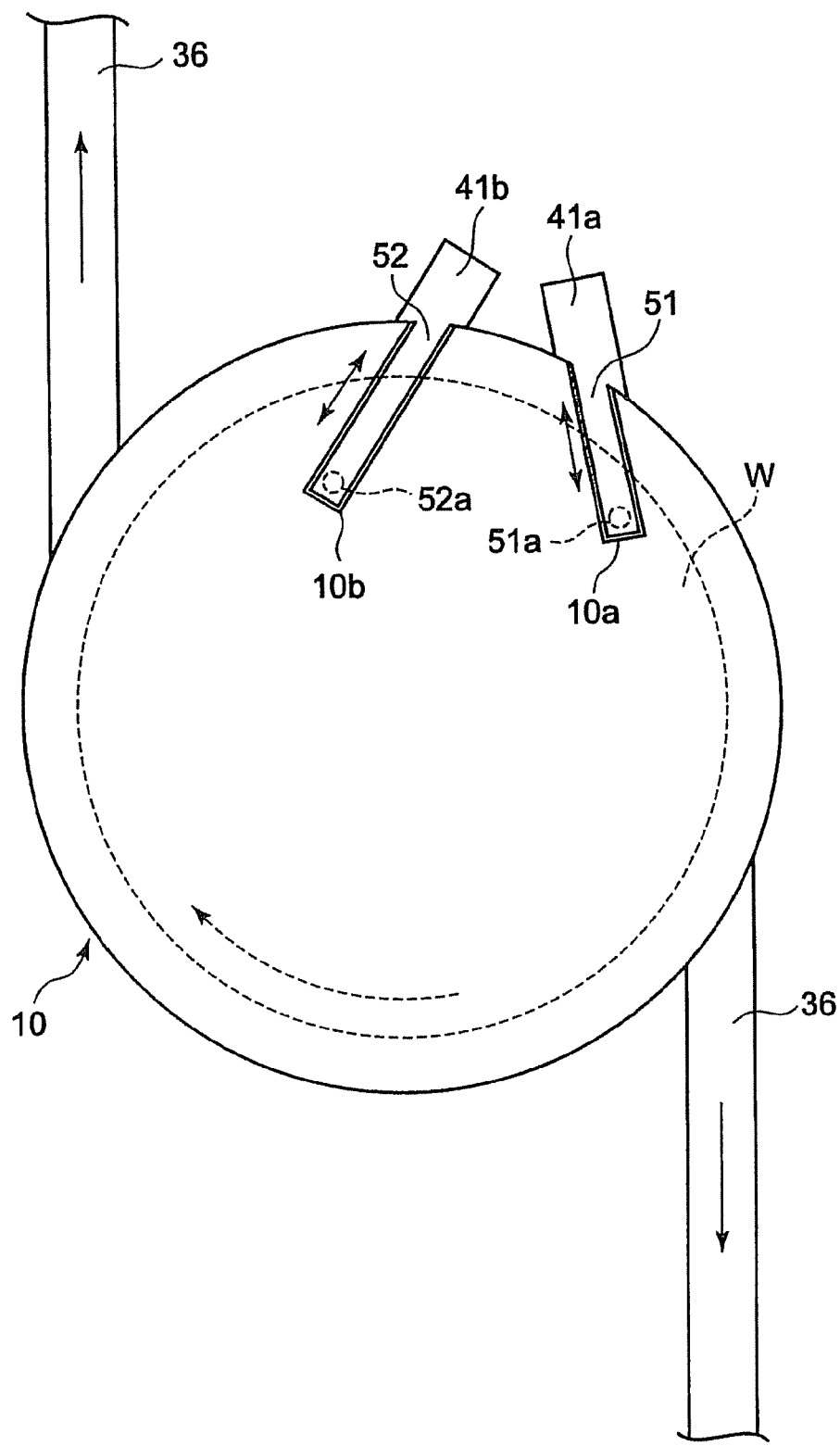
FIG. 2 is a top sectional view showing the liquid processing apparatus in the embodiment of the present invention.
Figure 3:
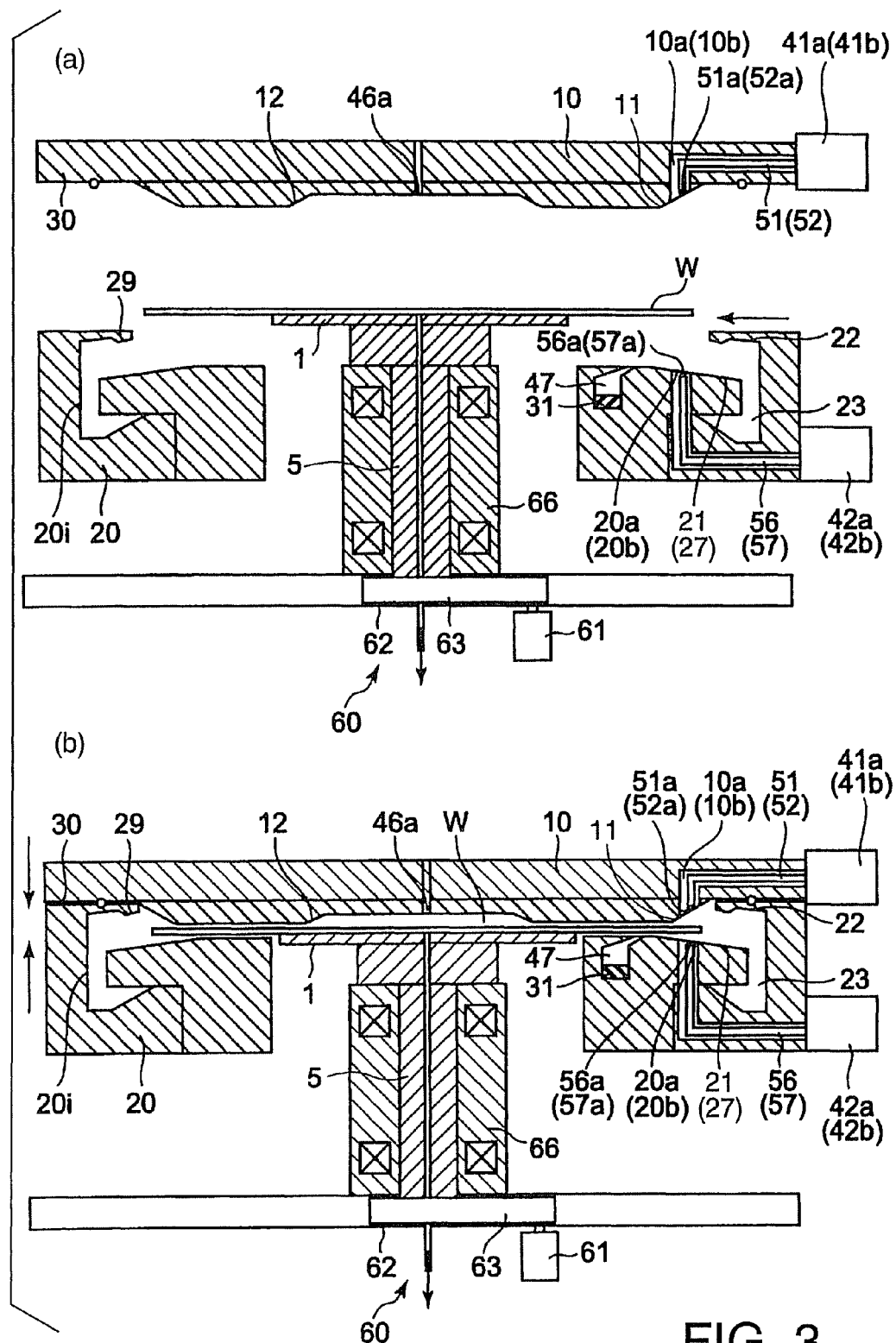
FIG. 3 is a schematic longitudinal sectional view showing a driving manner of the liquid processing apparatus in the embodiment of the present invention.

As shown in FIG. 2, the front-side process-liquid supply nozzles 51*a* and 52 have horizontal driving parts 41*a* and 41*b*, respectively. The front-side process-liquid supply nozzles 51*a* and 52*a* can be horizontally moved within the elongate holes 10*a* and 10*b* by the horizontal driving parts 41*a* and 41*b*.

In the present invention, the cleaning liquid means a chemical liquid or a rinse liquid. For example, dilute hydrofluoric acid may be used as the chemical liquid. On the other hand, deionized water (DIW) may be used as the rinse liquid, for example.

As shown in FIG. 2, the front-side process-liquid supply nozzles 51*a* and 52*a* have the front-side chemical-liquid supply nozzle 51*a* configured to supply the chemical liquid supplied from a chemical-liquid supply part (not shown) to the front surface of the wafer W, and the front-side rinse-liquid supply nozzle 52*a* configured to supply the rinse liquid supplied from a rinse-liquid supply part (not shown) to the front surface of the wafer W.

As shown in FIG. 2, the front-side chemical-liquid supply nozzle 51*a* is connected to the horizontal driving part 41*a* through a connecting member 51. When the connecting member 51 is horizontally moved, the front-side chemical-liquid supply nozzle 51*a* is horizontally moved. Similarly, the front-side rinse-liquid supply nozzle 52*a* is connected to the horizontal driving part 41*b* through a connecting member 52. When the connecting member 52 is horizontally moved, the front-side rinse-liquid supply nozzle 52*a* is horizontally moved. The front-side rinse-liquid supply nozzle 52*a* can be moved to a position that is more inward of the wafer W than a position to which the front-side chemical-liquid supply nozzle 51*a* can be moved (the elongate hole 10*b* extends to a position that is more inward of the wafer W than a position to which the elongate hole 10*a* extends). Thus, the front-side rinse-liquid supply nozzle 52*a* can supply the rinse liquid to the wafer W at the position that is more inward of the wafer W than the position at which the front-side chemical-liquid supply nozzle 51*a* supplies the chemical liquid to the wafer W.

As shown in FIG. 1, at a position opposed to a peripheral portion of the rear surface of the wafer W held by the holding part 1, the lower cup 20 has a rear-side inclined part 27 that is inclined downward so as to draw away from the wafer W toward the periphery of the wafer W. The rear-side inclined part 27 is equipped with elongate holes 20*a* and 20*b*. Disposed in the elongate holes 20*a* and 20*b* are rear-side process-liquid supply nozzles 56*a* and 57*a* which are configured to supply a cleaning liquid onto the peripheral portion of the rear surface of the wafer W.

The rear-side chemical-liquid nozzle 56*a* is connected to a horizontal driving part 42*a* through a connecting member 56. When the connecting member 56 is horizontally moved, the rear-side chemical-liquid supply nozzle 56*a* is horizontally moved. Similarly, the rear-side rinse-liquid supply nozzle 57*a* is connected to a horizontal driving part 42*b* through a connecting member 57. When the connecting member 57 is horizontally moved, the rear-side rinse-liquid supply nozzle 57*a* is horizontally moved.

The rear-side process liquid supply nozzles 56*a* and 57*a* are also composed of the rear-side chemical-liquid supply nozzle 56*a* configured to supply the chemical liquid supplied from the chemical-liquid supply part (not shown) to the rear surface of the wafer W, and the rear-side rinse-liquid supply nozzle 57*a* configured to supply the rinse liquid supplied from the rinse-liquid supply part (not shown) to the rear surface of the wafer W. The rear-side chemical-liquid supply nozzle 56*a* can be moved to a position that is more inward of the wafer W than a position to which the rear-side chemical-liquid supply nozzle 56*a* can be moved. Thus, the rear-side rinse-liquid supply nozzle 57*a* can supply the rinse liquid to the wafer W at the position that is more inward of the wafer W than the position at which the rear-side chemical-liquid supply nozzle 56*a* supplies the chemical liquid to the wafer W.

As shown in FIG. 1, the lower cup 20 includes: a front-side guide part 22 disposed on a side of the front surface of the wafer W held by the holding part 1, the front-side guide part 22 being configured to guide the cleaning liquid having been passed through the front surface of the wafer W; a rear-side guide part 21 disposed on a side of the rear surface of the wafer W held by the holding part 1, the rear-side guide part 21 being configured to guide the cleaning liquid having been passed through the rear surface of the wafer W; and a storage part 23 configured to receive the cleaning liquid guided by the front-side guide part 22 and the rear-side guide part 21 and store the process liquid. The rear-side guide part 21 projects outward in the peripheral direction, so that a gap G between the rear-side guide part 21 and an inner wall 20*i* of the lower cup 20 is narrowed.

In this embodiment, the rear-side inclined part 27 serves also as the rear-side guide part 21. However, not limited thereto, the rear-side inclined part 27 and the rear-side guide part 21 may be separate members. In this case, the rear-side guide part 21 is positioned outside the periphery of the rear-side inclined part 27.

As shown in FIG. 1, a projecting part 29 is disposed inside the front-side guide part 22 of the lower cup 20. The projecting part 29 prevents sputtering and scattering of a cleaning liquid supplied to the wafer W.

Further, as shown in FIG. 1, the lower cup 20 is provided with a rear-side nitrogen-gas supply part (nitrogen-gas supply part) 47 configured to supply a nitrogen gas to the rear surface of the wafer W held by the holding part 1. The rear-side nitrogen-gas supply part 47 has a heating part 31 configured to heat the nitrogen gas supplied from the rear-side nitrogen-gas supply part 47.

Furthermore, as shown in FIG. 1, formed in a central portion of the upper cup 10 is a front-side nitrogen-gas supply opening 46a through which a nitrogen gas is supplied to the front surface of the wafer W held by the holding part 1.

A front-side nitrogen-gas supply part 46 configured to supply a nitrogen gas is connected to the front-side nitrogen-gas supply opening 46a. The upper cup 10 has a downward inclined part 12 whose lower surface is inclined downward so as to narrow a gap between the wafer W and the upper cup 10.

As shown in FIG. 2, connected to the lower cup 20 is a drain pipe (drain part) 36 configured to drain a gas (such as nitrogen gas) and a cleaning liquid such as a chemical liquid and a rinse liquid, which are contained in a space that is defined by the upper cup 10 and the lower cup 20 when the gap between the upper cup 10 and the lower cup 20 is hermetically sealed. On a downstream side of the drain pipe 36, there is disposed a gas-liquid separating part (not shown) configured to separate a gas such as a nitrogen gas and a cleaning liquid (liquid) such as a chemical liquid and a rinse liquid from each other.

Next, an operation of the embodiment as structured above is described.

At first, the upper cup 10 is moved upward and located at an upper position, and the lower cup 20 is moved downward and located at a lower position (see, FIG. 3(a)) (separating step). Then, a wafer W is held on the holding part 1 by a wafer transfer robot (not shown), and the wafer is held by the holding part 1 (see, FIG. 3(a)) (holding step).

In this embodiment, since the upper cup 10 is moved upward and the lower cup 20 is moved downward, a wafer W can be easily placed on the holding part 1 by the wafer transfer robot. Thus, a peripheral portion of the wafer W can be easily located on a predetermined process position (a position opposed to the front-side process-liquid supply nozzles 51a and 52a and the rear-side process-liquid supply nozzles 56a and 57a).

Then, the upper cup 10 is moved downward and located at a lower position, and the lower cup 20 is moved upward and located at an upper position, so that the upper cup 10 and the lower cup 20 are brought into contact with each other (see, FIG. 3(b)) (contacting step). At this time, the gap between the upper cup 10 and the lower cup 20 is hermetically sealed by the seal member 30 provided on the upper cup 10.

Thereafter, the rotating shaft 5 is driven to be rotated by the rotation driving part 60, so that the wafer W held by the holding step 1 is rotated (see, FIG. 3(b)) (rotating step). At this time, the rotating shaft 5 is driven to be rotated by a driving force imparted by the motor 61 to the pulley 62 through the driving belt 63.

Then, a nitrogen gas supplied from the front-side nitrogen-gas supply part 46 is supplied toward a front surface of the wafer W via the front-surface nitrogen-gas supply opening 46a formed in the upper cup 10. At this time, a nitrogen gas is also supplied toward a rear surface of the wafer W from the rear-side nitrogen-gas supply part 47. The following steps are performed during when the nitrogen gas is supplied toward the front surface and the rear surface of the wafer W.

Following thereto, a chemical liquid is supplied from the front-side chemical-liquid supply nozzle 51a toward the front surface of the wafer W (front-side chemical-liquid supplying step). Before the chemical liquid is supplied from the front-side chemical-liquid supply nozzle 51a, the front-side chemical-liquid supply nozzle 51a can be moved along the elongate hole 10a by the horizontal driving part 41a such that the front-side chemical-liquid supply nozzle 51a can be arranged in position (see, FIG. 2). However, not limited thereto, the front-side chemical-liquid supply nozzle 51a may be moved along the elongate hole 10a by the horizontal driving part 41a such that the front-side chemical-liquid supply nozzle 51a can be, while the chemical liquid is being supplied from the front-side chemical-liquid supply nozzle 51a.

At the position opposed to a peripheral portion of the front surface of the wafer W held by the holding part 1, the upper cup 10 has the front-side inclined part 11 that is inclined upward so as to draw away from the wafer W toward the periphery of the wafer W, and the front-side chemical-liquid supply nozzle 51a is disposed on the front-side inclined part 11 (see, FIG. 1).

Since the front-side inclined part 11 is inclined upward so as to draw away from the wafer W toward the periphery of the wafer W (the front-side inclined part 11 is inclined downward so as to come close to the wafer W toward a center of the wafer W), the peripheral portion of the wafer W can be processed under conditions where the chemical liquid supplied from the front-side chemical-liquid supply nozzle 51a is accumulated on the peripheral portion of the wafer W. Thus, the process-liquid can be prevented from moving toward the center of the wafer W across a predetermined range, which might be caused when the process liquid is brought into contact with the upper cup 10. As a result, only the predetermined range of the front surface of the wafer W can be precisely processed. In general, since the front surface of the wafer W is patterned, it should be avoided that a range other than the predetermined range is accidentally processed, when the peripheral portion of the wafer W is processed. This embodiment can reliably cope with this requirement.

In addition, since the gap that widens toward the periphery of the wafer W can be defined between the front surface of the wafer W and the upper cup 10 (see, FIG. 1), the wafer W can be rotated, with the chemical liquid adhering to the front surface of the wafer W. Thus, the front surface of the wafer W can be processed with the chemical liquid over a predetermined period of time, whereby the front surface of the wafer W can be reliably processed. A thickness of a liquid film of the cleaning liquid is increased toward the periphery of the wafer W by the centrifugal force acting on the wafer W. Thus, the formation of the gap that widens toward the periphery of the wafer W as in this embodiment is preferred.

Further, it can be prevented that an adverse affect is given to a wafer W to be subsequently processed, which might be caused when the chemical liquid on the front surface of the wafer W adheres to the upper cup 10. That is to say, when the chemical liquid on the front surface of the wafer W adheres to a bottom surface of the upper cup 10, the chemical liquid may remain thereon as a residue, resulting in an adverse affect to a wafer W to be subsequently processed. However, in this embodiment, since the gap that widens toward the periphery of the wafer W can be defined between the front surface of the wafer W and the upper cup 10, the chemical liquid placed on the front surface of the wafer W can be prevented from adhering to the upper cup 10. Thus, it can be prevented that an adverse affect is given to a wafer W to be subsequently processed.

The front-side chemical-liquid supply nozzle 51a can be moved along the elongate hole 10a. It is sufficient that the elongate hole 10 is formed only in a range where the front-side chemical-liquid supply nozzle 51a is moved. Thus, the size of the elongate hole 10a in the upper cup 10 can be reduced. As a result, a turbulence of an airflow, which is generated by the rotation of the wafer W, can be prevented on a side of the front surface of the wafer W, whereby the wafer W can be precisely processed.

During the aforementioned front-side chemical-liquid supplying step, the chemical liquid is also supplied from the rear-side chemical-liquid supply nozzle 56*a* toward the rear surface of the wafer W (rear-side chemical-liquid supplying step). Before the chemical liquid is supplied from the rear-side chemical-liquid supply nozzle 56*a*, the rear-side chemical-liquid supply nozzle 56*a* can be moved along the elongate hole 20*a* by the horizontal driving part 42*a* such that the rear-side chemical-liquid supply nozzle 56*a* is arranged in position. However, not limited thereto, the rear-side chemical-liquid supply nozzle 56*a* may be moved along the elongate hole 20*a* by the horizontal driving part 42*a* such that the rear-side chemical-liquid supply nozzle 56*a* is arranged in position, while the chemical liquid is being supplied from the rear-side chemical-liquid supply nozzle 56*a*.

At the position opposed to a peripheral portion of the rear surface of the wafer W held by the holding part 1, the lower cup 20 has the rear-side inclined part 27 that is inclined downward so as to draw away from the wafer W toward the periphery of the wafer W, and the rear-side chemical-liquid supply nozzle 56*a* is disposed on the rear-side inclined part 27 (see, FIG. 1).

Thus, it can be prevented that the chemical liquid supplied from the rear-side chemical-liquid supply nozzle 56*a* moves toward the center of the wafer W across a predetermined range by a surface tension or the like. As a result, only the predetermined range of the rear surface of the wafer W can be precisely processed.

The rear-side chemical-liquid supply nozzle 56*a* can be moved along the elongate hole 20*a*. It is sufficient that the elongate hole 20*a* is formed only in a range where the rear-side chemical-liquid supply nozzle 56*a* is moved. Thus, similarly to the elongate hole 10*a* formed in the upper cup 10, the size of the elongate hole 20*a* in the lower cup 20 can be reduced. As a result, a turbulence of an airflow, which is generated by the rotation of the wafer W, can be prevented on a side of the rear surface of the wafer W, whereby the wafer W can be precisely processed.

After that, as described above, the chemical liquid supplied from the front-side chemical-liquid supply nozzle 51*a* and the rear-side chemical-liquid supply nozzle 56*a* is received by the storage part 23 and stored therein, and thereafter the chemical liquid is drained by the drain pipe 36.

Then, a rinse liquid is supplied from the front-side rinse-liquid supply nozzle 52*a* toward the front surface of the wafer W (front-side rinse-liquid supplying step).

At this time, similarly to the front-side chemical-liquid supplying step, it can be prevented that the rinse liquid supplied from the front-side rinse-liquid supply nozzle 52*a* moves toward the center of the wafer W across a predetermined range by a surface tension or the like. Thus, the rinse liquid can be supplied to only the predetermined range of the front surface of the wafer W. As a result, the rinse liquid can be prevented from remaining on the wafer W so as to form watermarks on the front surface of the wafer W.

In addition, the rinse liquid is supplied from the rear-side rinse-liquid supply nozzle 57*a* toward the rear surface of the wafer W (rear-side rinse-liquid supplying step).

After that, the rinse liquid supplied from the front-side rinse-liquid supply nozzle 56*a* and the rear-side rinse-liquid supply nozzle 57*a* is received by the storage part 23 and stored therein, and thereafter the rinse liquid is drained by the drain pipe 36.

Similarly to the rear-side chemical-liquid supplying step, it can be prevented that the rinse liquid supplied from the rear-side rinse-liquid supply nozzle 57*a* moves toward the center of the wafer W across a predetermined range by a surface tension or the like. Thus, the rinse liquid can be supplied to only the predetermined range of the rear surface of the wafer W. As a result, the rinse liquid can be prevented from remaining on the wafer W so as to form watermarks on the rear surface of the wafer W.

The front-side rinse-liquid supply nozzle 52*a* can be moved to a position that is more inward of the wafer W than a position to which the front-side chemical-liquid supply nozzle 51*a* can be moved, so that the front-side rinse-liquid supply nozzle 52*a* can supply the rinse liquid to the wafer W at the position that is more inward of the wafer W than the position at which the front-side chemical-liquid supply nozzle 51*a* can supply the chemical liquid to the wafer W (see, FIG. 2).

Thus, the chemical liquid adhering on the front surface of the wafer W can be reliably removed therefrom by the rinse liquid supplied from the inward position of the wafer W.

Similarly, the rear-side rinse-liquid supply nozzle 57*a* can be moved to a position that is more inward of the wafer W than a position to which the rear-side chemical-liquid supply nozzle 56*a* can be moved, so that the rear-side rinse-liquid supply nozzle 57*a* can supply the rinse liquid to the wafer W at the position that is more inward of the wafer W than the position at which the rear-side chemical-liquid supply nozzle 56*a* can supply the chemical liquid to the wafer W. Thus, the chemical liquid adhering on the rear surface of the wafer W can be reliably removed therefrom by the rinse liquid supplied from the inward position of the wafer W.

Further, similarly to the elongate holes 10*a* and 20*b*, the sizes of the elongate hole 10*b* and the elongate hole 20*b* can be reduced. Therefore, a turbulence of an airflow, which is generated by the rotation of the wafer W, can be prevented on both sides of the front surface and the rear surface of the wafer W.

Although this embodiment has been described by taking an example where the front-side chemical-liquid supply nozzle 51*a* and the front-side rinse-liquid supply nozzle 52*a* are the separate members and the rear-side chemical-liquid supply nozzle 56*a* and the rear-side rinse-liquid supply nozzle 57*a* are the separate members, the present invention is not limited thereto. For example, the chemical liquid and the rinse liquid may be supplied from the common supply part, when a concentration of the chemical liquid is thin. However, even in such a case, it is preferable that a position at which the rinse liquid is supplied to the wafer W is located inward a position at which the chemical liquid is supplied to the wafer W.

In the aforementioned rear-side chemical-liquid supplying step and the rear-side rinse-liquid supplying step, a nitrogen gas heated by the heating part 31 is supplied to the rear surface of the wafer W. Thus, the rear surface of the wafer W can be processed, while heated by the heated nitrogen gas.

In the above embodiment, the chemical liquid and the rinse liquid to be supplied to the rear surface of the wafer W are heated by the nitrogen gas heated by the heating part 31, which is by way of example, and the present invention is not limited thereto. For example, instead of the heating part 31 for heating a nitrogen gas, a heating part for directly heating the chemical liquid and the rinse liquid to be supplied to the rear surface of the wafer W may be provided, or a heating part for heating the chemical liquid and the rinse liquid to be supplied to the front surface of the wafer W may be provided.

In the aforementioned front-side chemical-liquid supplying step, the rear-side chemical-liquid supplying step, the front-side rinse-liquid supplying step, and the rear-side rinse-liquid supplying step, the nitrogen gas is continuously supplied to the front surface and the rear surface of the wafer W. Thus, the chemical liquid and the rinse liquid supplied to the wafer W can be reliably prevented from moving toward the center of the wafer W across a predetermined range.

As shown in FIG. 1, the upper cup 10 has the downward inclined part 12 that is inclined downward such that the gap between the wafer W and the upper cup 10 is narrowed in the peripheral direction from the central portion of the wafer W. Thus, in the front-side chemical-liquid supplying step and the front-side rinse-liquid supplying step a flow rate of the nitrogen gas supplied from the front-side nitrogen-gas opening 46a can be accelerated toward the periphery of the wafer W. Therefore, the chemical liquid and the rinse liquid supplied to the wafer W can be further reliably prevented from moving toward the center of the wafer W across a predetermined range.

As shown in FIG. 1, the rear-side guide part 21 projects outward in the peripheral direction, so that the gap G between the rear-side guide part 21 and the inner wall 20i of the lower cup 20 is narrowed. Thus, when the nitrogen gas and the cleaning liquid, which have been used in the front-side chemical-liquid supplying step, the rear-side chemical-liquid supplying step, the front-side rinse-liquid supplying step, and the rear-side rinse-liquid supplying step, are guided to the storage part 23, a flow path thereof is narrowed. As a result, the nitrogen gas and the cleaning liquid can be uniformly drained by the drain pipe 36 (see, FIG. 2).

As shown in FIG. 2, the drain pipe 36 drains the nitrogen gas and the cleaning liquid having been guided to the storage part 23, along the rotating direction of the wafer W. Thus, the nitrogen gas and the cleaning liquid can be reliably drained by the drain pipe 36.

As described above, after a predetermined time has passed from when the rinse liquid is supplied to the front surface and the rear surface of the wafer W, the supply of the rinse liquid from the rinse-liquid supply part (not shown) is stopped. After that, the wafer W is rotated at a high speed by the rotation driving part 60, so that the peripheral portion of the wafer W is dried (drying step).

Then, the upper cup 10 is moved upward and located at the upper position, and the lower cup 20 is moved downward and located at the lower position (see, FIG. 3(a)) (separating step). Thereafter, the wafer W is removed from the holding part 1 by the wafer transfer robot (not shown) (unloading step).

In this manner, in this embodiment, since the upper cup 10 is moved upward and the lower cup 20 is moved downward, the wafer W placed on the holding part 1 can be easily removed.

Moreover, in this embodiment, the wafer W is loaded and unloaded by the upward movement and the downward movement of the upper cup 10 and the lower cup 20. Thus, it is not necessary for a collecting cup for collecting a spun-off process liquid to have a size allowing that an outside part of the periphery of the wafer W is surrounded by the collecting cup, which is necessary in the conventional technique. Thus, the horizontal size of the liquid processing apparatus can be reduced.

In addition, since the process space is defined between the upper cup 10 and the lower cup 20 when the upper cup 10 and the lower cup 20 are in contact with each other, the process space in which the peripheral portion of the wafer W is processed can be made smaller. Thus, an atmosphere in the process space can be easily controlled. Further, an amount of the cleaning liquid to be evaporated can be decreased. Furthermore, a supply amount and a drain amount of the nitrogen gas can be decreased.

When the upper cup 10 and the lower cup 20 are in contact with each other, the gap between the upper cup 10 and the lower cup 20 is hermetically sealed by the seal member 30. Thus, outflowing of the chemical liquid to the outside can be prevented. Accordingly, an adhesion of the chemical liquid onto other units and an adverse affect given by the chemical liquid to a human body can be more reliably prevented.

Since outflowing of the chemical liquid to the outside can be prevented, only the upper cup 10, the lower cup 20, the front-side process-liquid nozzles 51a and 52a, and the rear-side process-liquid supply nozzles 56a and 57a should have a chemical-proof property. Namely, other members do not need to have a chemical-proof property. Therefore, the manufacturing cost of the liquid processing apparatus can be lowered.

In this embodiment, a front-side process-liquid supplying step is composed of the front-side chemical-liquid supplying step and the front-side rinse-liquid supplying step, and a rear-side process-liquid supplying step is composed of the rear-side chemical-liquid supplying step and the rear-side rinse-liquid supplying step.

The invention claimed is:

1. A liquid processing apparatus comprising:
a second housing;
a first housing disposed opposedly to the second housing;
a holding part disposed inside the second housing, the holding part being configured to hold an object to be processed;
a rotation driving part configured to rotate the object to be processed held by the holding part;
a front-side process-liquid supply nozzle configured to supply a process liquid onto a peripheral portion of a front surface of the object to be processed held by the holding part; and
a storage part disposed on a side of a rear surface of the object to be processed held by the holding part, the storage part being configured to receive the process liquid having been passed on the object to be processed and store the process liquid;
wherein the respective first housing and the second housing can be moved in one direction, so that the first housing and the second housing can be brought into contact with each other and separated apart from each other,
wherein the first housing has a front-side inclined part that is upwardly inclined so as to draw away from the object to be processed towards the periphery of the object to be processed, at a position opposed to the peripheral portion of the front surface of the object to be processed held by the holding part,
wherein a tip of the front-side process-liquid supply nozzle, from which the process liquid is supplied, is disposed in an opening formed on the front-side inclined part which is inclined upwardly towards the periphery of the first housing, and
wherein the process liquid placed on the periphery of the object to be processed is prevented from adhering to the first housing due to the fact that the front-side inclined part is inclined upwardly toward the periphery of the first housing.

2. The liquid processing apparatus according to claim 1, further comprising a rear-side guide part disposed on the side of the rear surface of the object to be processed held by the holding part so as to project outward in a peripheral direction, the rear-side guide part being configured to guide the process liquid having been passed through the object to be processed,
wherein the storage part is disposed to the rear-side guide part on a side opposite to the side of the first housing, and is configured to receive the process liquid having been guided by the rear-surface guide part and store the process liquid.

3. The liquid processing apparatus according to claim 1, further comprising a seal member configured to be disposed between the first housing and the second housing, so as to hermetically seal a gap between the first housing and the second housing.

4. The liquid processing apparatus according to claim 1, further comprising a front-side guide part disposed on the side of the front surface of the object to be processed held by the holding part, the front-side guide part being configured to guide the process liquid having been passed through the front surface of the object to be processed.

5. The liquid processing apparatus according to claim 1, further comprising a heating part configured to heat the object to be processed.

6. The liquid processing apparatus according to claim 1, further comprising:
a nitrogen-gas supply part configured to supply a nitrogen gas to the object to be processed held by the holding part; and
a heating part configured to heat the nitrogen gas supplied from the nitrogen-gas supply part.

7. The liquid processing apparatus according to claim 1, further comprising a drain part configured to drain a gas or a liquid contained in a space defined between the first housing and the second housing,
wherein the drain part drains the gas or the liquid contained in the space, along a rotating direction of the object to be processed.

8. The liquid processing apparatus according to claim 1, wherein
the second housing has:
a rear-side inclined part that is inclined so as to draw apart from the object to be processed toward the periphery of the object to be processed, at a position opposed to the peripheral portion of the rear surface of the object to be processed; and
a rear-side process-liquid supply nozzle disposed on the rear-side inclined part, the rear-side process-liquid supply nozzle being configured to supply the process liquid onto the peripheral portion of the rear surface of the object to be processed.

9. The liquid processing apparatus according to claim 1, wherein
the front-side process-liquid supply nozzle has a front-side chemical-liquid supply nozzle configured to supply a chemical liquid and a front-side rinse-liquid supply nozzle configured to supply a rinse liquid, and
a position at which the rinse liquid is supplied from the front-side rinse-liquid supply nozzle to the object to be processed is more inward than a position at which the chemical liquid is supplied from the front-side chemical-liquid supply nozzle to the object to be processed.

10. A liquid processing method to be performed by a liquid processing apparatus comprising: a second housing; a first housing having a front-side upwardly inclined part and process liquid supply means configured to draw apart from an object to be processed towards the periphery of the object to be processed that is disposed oppositely to the second housing; a holding part disposed inside the second housing, the holding part being configured to hold the object to be processed; a rotation driving part configured to rotate the object to be processed held by the holding part; and a storage part disposed on a side of a rear surface of the object to be processed held by the holding part;
the liquid processing method comprising:
separating the respective first housing and the second housing apart from each other;
holding the object to be processed by the holding part;
bringing the respective first housing and the second housing close to each other and into contact with each other;
rotating the object to be processed held by the holding part;
supplying a process liquid by the front-side upwardly inclined process liquid supply means onto a peripheral portion of a front surface of the object to be processed held by the holding part, wherein the front-side upwardly inclined process liquid supply means has a front-side process liquid supply nozzle disposed on the front-side upwardly inclined part; and
receiving the process liquid having been passed through the object to be processed by the storage part and storing the process liquid in the storage part.

* * * * *